(12) United States Patent
Neudorf

(10) Patent No.: US 12,294,639 B2
(45) Date of Patent: *May 6, 2025

(54) CONTINUOUSLY CHANGING SYSTEM CLOCK IN A PACKET PROCESSING MODULE BASED ON LOAD DETERMINED BY DETERMINISTIC FEEDBACK SIGNALS

(71) Applicant: Ciena Corporation, Hanover, MD (US)

(72) Inventor: Kenneth Edward Neudorf, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/542,963

(22) Filed: Dec. 18, 2023

(65) Prior Publication Data

US 2025/0030533 A1    Jan. 23, 2025

Related U.S. Application Data

(63) Continuation-in-part of application No. 18/354,075, filed on Jul. 18, 2023.

(51) Int. Cl.
*H04L 7/033* (2006.01)
*H03L 7/08* (2006.01)

(52) U.S. Cl.
CPC ............. *H04L 7/033* (2013.01); *H03L 7/08* (2013.01)

(58) Field of Classification Search
CPC ......... H04L 7/033; H04L 49/90; H04L 47/10; H04L 47/30; H04L 47/12; H04L 7/0331; H03L 7/08; G06F 1/08
See application file for complete search history.

(56) References Cited

U.S. PATENT DOCUMENTS

| | | | | |
|---|---|---|---|---|
| 5,526,362 A | * | 6/1996 | Thompson | H04Q 11/0478 375/376 |
| 5,859,850 A | * | 1/1999 | Lien | H04Q 11/0478 370/473 |
| 7,176,928 B1 | * | 2/2007 | Sendrovitz | H04L 7/02 345/534 |
| 7,317,725 B2 | | 1/2008 | Etemadi et al. | |
| 7,646,836 B1 | * | 1/2010 | Mays | H04L 12/6418 375/372 |
| 7,769,015 B2 | | 8/2010 | Huang et al. | |

(Continued)

OTHER PUBLICATIONS

Wenlei Bao et al., "Static and Dynamic Frequency Scaling on Multicore CPUs," CM Trans. Archit. Code Optim. 13, 4, Article 51, Dec. 2016, 26 pages.

*Primary Examiner* — Sophia Vlahos
(74) *Attorney, Agent, or Firm* — Baratta Law PLLC; Lawrence A. Baratta, Jr.

(57) ABSTRACT

A packet processing module includes circuitry configured to receive feedback signals from each of N first-in, first-out (FIFOs), N is an integer that is greater than or equal to 1, determine a clock speed for the packet processing module based on the received feedback signals, and program a phase lock loop (PLL) based on the determined clock speed where the PLL provides a module clock at the determined clock speed to a packet processing circuit which is configured to receive and process packets from the N FIFOs. The feedback signals are a deterministic representation of processing needed for the packet processing circuit given a current state of packets available.

17 Claims, 4 Drawing Sheets

(56) References Cited

U.S. PATENT DOCUMENTS

| | | | |
|---|---|---|---|
| 8,239,579 B2 * | 8/2012 | Tang | H04J 3/047 |
| | | | 709/251 |
| 8,886,878 B1 | 11/2014 | Neudorf et al. | |
| 8,971,471 B2 * | 3/2015 | Kim | H04J 3/0632 |
| | | | 375/372 |
| 9,438,431 B2 * | 9/2016 | Abbas | H04L 5/1446 |
| 9,444,566 B1 | 9/2016 | Mustiere et al. | |
| 9,497,522 B2 | 11/2016 | Neudorf | |
| 10,136,384 B1 * | 11/2018 | Mauer | H04W 52/0206 |
| 10,374,786 B1 | 8/2019 | Mustiere et al. | |
| 11,018,674 B1 | 5/2021 | Neudorf et al. | |
| 2005/0086553 A1 * | 4/2005 | Spencer | G06K 19/07732 |
| | | | 713/600 |
| 2007/0041391 A1 * | 2/2007 | Lin | H04L 49/90 |
| | | | 370/352 |
| 2008/0145065 A1 * | 6/2008 | Kawamura | H04J 3/073 |
| | | | 398/182 |
| 2009/0310729 A1 * | 12/2009 | Liu | H04L 7/02 |
| | | | 375/376 |
| 2012/0155476 A1 * | 6/2012 | Pavani | H04J 3/0632 |
| | | | 370/400 |
| 2012/0223742 A1 * | 9/2012 | Kadosh | G06F 1/08 |
| | | | 326/93 |
| 2013/0170369 A1 * | 7/2013 | Liao | H04J 3/0635 |
| | | | 370/252 |
| 2019/0288788 A1 * | 9/2019 | Bengtsson | H04L 1/0018 |
| 2022/0155991 A1 | 5/2022 | Neudorf | |
| 2022/0294703 A1 * | 9/2022 | Dejanovic | H04L 41/145 |

* cited by examiner

CONTINUOUSLY CHANGING SYSTEM CLOCK IN A PACKET PROCESSING MODULE BASED ON LOAD DETERMINED BY DETERMINISTIC FEEDBACK SIGNALS

CROSS-REFERENCE TO RELATED APPLICATION(S)

The present disclosure is a continuation-in-part of U.S. patent application Ser. No. 18/354,075, filed Jul. 18, 2023, the contents of which are incorporated by reference in their entirety.

FIELD OF THE DISCLOSURE

The present disclosure relates generally to networking and computing. More particularly, the present disclosure relates to systems and methods for continuously changing system clock in a packet processing module based on load, such as determined by first-in, first-out (FIFO(s)) fill level, packet available signals, and the like.

BACKGROUND OF THE DISCLOSURE

Electronic circuits such as field programmable gate arrays (FPGAs), application specific integrated circuits (ASICs), network processing units (NPUs), and the like (collectively referred to as a "module" or "processing module") utilize a system clock having a specified frequency, usually in MHz or GHz. Most modules run off a fixed clock rate or a set of clock rates. Conventional designs include (1) multiple fixed clocks that can be multiplexed onto the clock driving the processing module, and (2) fixed steps of clock frequencies programmed into a phase lock loop (PLL) for fixed output clock rates. Fixed step sizes usually means the design runs faster than required for any given load requirements.

BRIEF SUMMARY OF THE DISCLOSURE

The present disclosure relates to systems and methods for continuously changing system clock in a packet processing module based on load. In particular, the present disclosure is directed to optimally set the clock rate in a packet processing system or module. In packet processing, it is possible to continuously modify the clock rate to match the processing demand of the input to the module. The present disclosure includes a feedback loop based on first-in, first-out (FIFO (s)) fill level where the clock continuously is adjusted so that it runs at a minimum rate to continuously process incoming commands/data without overflowing the input FIFOs. In addition, the present disclosure includes a feedback loop based on packet available signals from the packet processing system or module. This approach will always run the clock at the slowest possible rate, which saves the maximum amount of power usage at all times. That is, the techniques described herein allow a deterministic setting of clock rate based on actual processing needs rather than a predictive one. Note, the terms optimally, absolute minimum, slowest possible, and maximum amount should be viewed in a relative sense as opposed to exact. Advantageously, the present disclosure provides lower power in packet processing systems or modules, e.g., routers, switches, modems, etc., which means smaller heatsinks, saving cost and space. The instantaneous power at any one time may still be the worst-case estimate, but the overall average power will be the absolute minimum due to the feedback between processing requirements and clock rate.

In an embodiment, a packet processing module includes circuitry configured to receive feedback signals from each of N first-in, first-out (FIFOs), N is an integer that is greater than or equal to 1, determine a clock speed for the packet processing module based on the received feedback signals, and program a phase lock loop (PLL) based on the determined clock speed where the PLL provides a module clock at the determined clock speed to a packet processing circuit which is configured to receive and process packets from the N FIFOs. The feedback signals can each be a packet available signal which is asserted for each of the N FIFOs based on detection of a complete packet therein for processing by the packet processing circuit. The determined clock speed can be set based on a number of packet available signals asserted at a given time. The determined clock speed can be set based on a number of packet available signals asserted at a given time multiplied by a minimum clock frequency which is set equal to a maximum clock frequency divided by N.

The feedback signals can each be a fill level of a given FIFO of the N FIFOs. The feedback signals are a deterministic representation of processing needed for the packet processing circuit given a current state of packets available. The circuitry can be further configured to continuously program the PLL based on the received feedback signals over time. The packet processing circuit can be configured to perform processing of control information in the received packets, processing of data content in the received packets, and a combination thereof. The packet processing circuit can be configured to perform processing of control information in the received packets. The packet processing circuit can be configured to perform processing of data content in the received packets.

In another embodiment, a method includes steps of receiving feedback signals from each of N first-in, first-out (FIFOs), N is an integer that is greater than or equal to 1; determining a clock speed for a packet processing module based on the received feedback signals; and programming a phase lock loop (PLL) based on the determined clock speed where the PLL provides a module clock at the determined clock speed to a packet processing circuit in the packet processing module which is configured to receive and process packets from the N FIFOs. The feedback signals can each be a packet available signal which is asserted for each of the N FIFOs based on detection of a complete packet therein for processing by the packet processing circuit. The determined clock speed can be set based on a number of packet available signals asserted at a given time. The determined clock speed can be set based on a number of packet available signals asserted at a given time multiplied by a minimum clock frequency which is set equal to a maximum clock frequency divided by N.

The feedback signals are can each be a fill level of a given FIFO of the N FIFOs. The feedback signals are a deterministic representation of processing needed for the packet processing circuit given a current state of packets available. The steps can further include continuously programming the PLL based on the received feedback signals over time. The packet processing circuit can be configured to perform processing of control information in the received packets, processing of data content in the received packets, and a combination thereof.

In a further embodiment, a packet processing module includes N first-in, first-out (FIFOs), N is an integer that is greater than or equal to 1; a programming state machine configured to feedback signals from each of the N FIFOs and to program a phase lock loop (PLL) based thereon; and a packet processing circuit configured to receive packets from the N FIFOs, wherein the packet processing circuit receives a module clock from the PLL with a speed determined by the programming state machine. The feedback signals can each be a packet available signal which is asserted for each of the N FIFOs based on detection of a complete packet therein for processing by the packet processing circuit.

In yet another embodiment, an apparatus includes circuitry configured to receive a fill level from N first-in, first-out (FIFOs), N is an integer that is greater than or equal to 1, determine a module clock speed based on the fill level, and program a phase lock loop (PLL) based on the determined module clock speed where the PLL provides a module clock at the module clock speed to a packet processing circuit configured to receive packets from the N FIFOs. The circuitry can be further configured to continuously program the PLL based on the fill level of the N FIFOs received over time. The packet processing circuit can be configured to perform processing of control information in the received packets, processing of data content in the received packets, and a combination thereof.

The PLL can be programmed to increase the module clock speed as the N FIFOs fill up and to decrease the module clock speed as the N FIFOs empty out. The PLL can be programmed to set the module clock speed to a highest rate when the fill level is above a high-water mark, and a minimum rate when the fill level is below a low-water mark. The PLL can be programmed to set the module clock speed to a highest rate when the fill level is above a high-water mark, a minimum rate when the fill level is below a low-water mark, and intermediate rates between the highest rate and the minimum rate when the fill level is between the high-water mark and the low-water mark. The module clock speed can have a linear relationship with the fill level. N can be greater than 1 and the fill level can be an aggregate of fill levels of each of the N FIFOs.

In yet another embodiment, a packet processing module includes N first-in, first-out (FIFOs), N is an integer that is greater than or equal to 1; a programming state machine configured to receive a fill level from the N FIFOs and to program a phase lock loop (PLL) based thereon; and a packet processing circuit configured to receive packets from the N FIFOs, wherein the packet processing circuit receives a module clock from the PLL with a speed determined by the programming state machine. The programming state machine can be configured to continuously program the PLL based on the fill level of the N FIFOs received over time. The packet processing circuit can be configured to perform processing of control information in the received packets, processing of data content in the received packets, and a combination thereof.

The PLL can be programmed by the programming state machine to increase the module clock speed as the N FIFOs fill up and to decrease the module clock speed as the N FIFOs empty out. The PLL can be programmed by the programming state machine to set the module clock speed to a highest rate when the fill level is above a high-water mark, and a minimum rate when the fill level is below a low-water mark. The PLL can be programmed by the programming state machine to set the module clock speed to a highest rate when the fill level is above a high-water mark, a minimum rate when the fill level is below a low-water mark, and intermediate rates between the highest rate and the minimum rate when the fill level is between the high-water mark and the low-water mark. The module clock speed can have a linear relationship with the fill level. N can be greater than 1 and the fill level can be an aggregate of fill levels of each of the N FIFOs.

In yet another embodiment, a method includes steps of receiving a fill level from N first-in, first-out (FIFOs), N is an integer that is greater than or equal to 1; determining a module clock speed based on the fill level; and programming a phase lock loop (PLL) based on the determined module clock speed where the PLL provides a module clock at the module clock speed to a packet processing circuit configured to receive packets from the N FIFOs. The steps can further include continuously programming the PLL based on the fill level of the N FIFOs received over time. The packet processing circuit can be configured to perform processing of control information in the received packets, processing of data content in the received packets, and a combination thereof. The PLL can be programmed to increase the module clock speed as the N FIFOs fill up and to decrease the module clock speed as the N FIFOs empty out.

BRIEF DESCRIPTION OF THE DRAWINGS

The present disclosure is illustrated and described herein with reference to the various drawings, in which like reference numbers are used to denote like system components/method steps, as appropriate, and in which.

DETAILED DESCRIPTION OF THE DISCLOSURE

Figure 1:
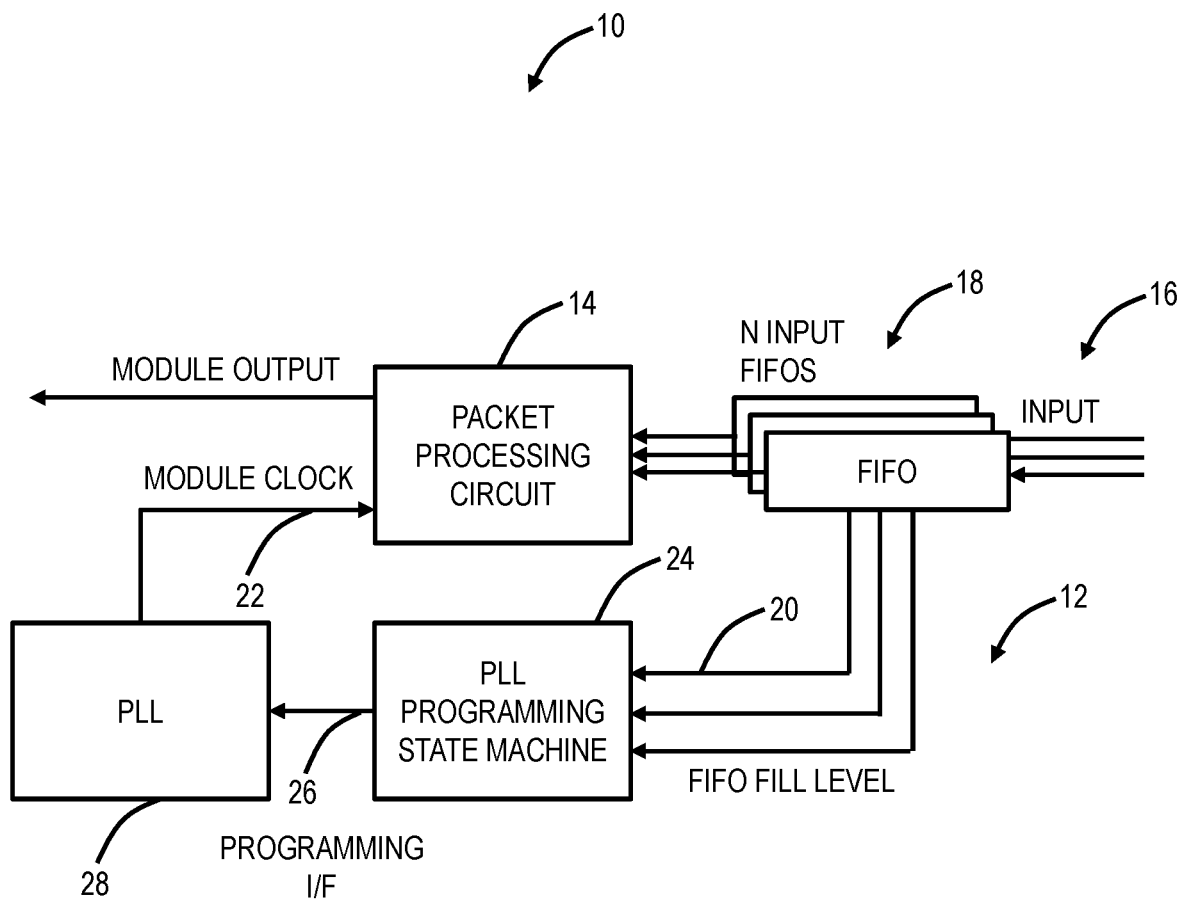
FIG. 1 is a block diagram of a packet processing module with a clock feedback loop.

Again, the present disclosure relates to systems and methods for continuously changing system clock in a packet processing module based on load. In particular, the present disclosure is directed to optimally set the clock rate in a packet processing system or module. In packet processing, it is possible to continuously modify the clock rate to match the processing demand of the input to the module. The present disclosure includes a feedback loop based on First-In-First-Out (FIFO(s)) fill level where the clock continuously is adjusted so that it runs at a minimum rate to continuously process incoming commands/data without overflowing the input FIFOs. In addition, the present disclosure includes a feedback loop based on packet available signals from the packet processing system or module. This approach will always run the clock at the slowest possible rate, which saves the maximum amount of power usage at all times. Note, the terms optimally, absolute minimum, slowest possible, and maximum amount should be viewed in a relative sense as opposed to exact, i.e., some improvement and not necessarily the absolute best. Advantageously, the present disclosure provides lower power in packet processing systems or modules, e.g., routers, switches, modems, etc., which means smaller heatsinks, saving cost and space. The instantaneous power at any one time may still be the worst-case estimate, but the overall average power will be the absolute minimum due to the feedback between processing requirements and clock rate.

Processing Module

The present disclosure relates to a processing circuit, module, system, etc. that is configured to process data. Again, a processing module operates at a fixed clock rate or a set of clock rates, which can be adjusted to provide different fixed rate clocks. The operating frequency of the system clock is directly correlated to power usage, i.e., the higher frequency, the higher power consumption. High power means higher cost, more requirements for cooling leading to wasted space, etc.

To that end, circuit designers have looked at dynamic frequency scaling, in the area of central processing units (CPUs). CPUs are a processing module that executes instructions of a computer program, such as arithmetic, logic, controlling, and input/output (I/O) operations. This role contrasts with that of external components, such as main memory and I/O circuitry, and specialized coprocessors such as graphics processing units (GPUs). Dynamic frequency scaling (also known as CPU throttling) is a power management technique in computer architecture whereby the frequency of a CPU can be automatically adjusted "on the fly" depending on the actual needs, to conserve power and reduce the amount of heat generated by the chip. Dynamic frequency scaling helps preserve battery on mobile devices and decrease cooling cost and noise on quiet computing settings, or can be useful as a security measure for overheated systems. Dynamic frequency scaling reduces the number of instructions a processor can issue in a given amount of time, thus reducing performance. Hence, it is generally used when the workload is not CPU-bound. Generally, dynamic frequency scaling is a collaborative process between the CPU and an operating system (OS) where, e.g., the CPU can expose various performance levels to the OS for selection based on current workload. Of note, this process is implemented in both hardware and software and is inexact as the selection is based on anticipated workload which really does not necessarily have an exact determination in a CPU.

Packet Processing Module

There is another class of processing module referred to herein as a packet processing module. As described herein, a packet processing module is a circuit, FPGA, ASIC, etc. responsible for performing operations on packets, e.g., Ethernet packets, Internet Protocol (IP) packets, or any protocol that supports packets. The packet processing module can be a network processor, network processing unit (NPU), system on a chip (SOC), packet processor, traffic manager, and the like.

Packet processing refers to the wide variety of algorithms that are applied to a packet of data or information as it moves through the various network elements of a communications network. With the increased performance of network interfaces, there is a corresponding need for faster packet processing. There are two broad classes of packet processing algorithms that align with the standardized network subdivision of control plane and data plane. The algorithms are applied to either:

(1) Control information contained in a packet which is used to transfer the packet safely and efficiently from origin to destination,
(2) The data content (frequently called the payload) of the packet which is used to provide some content-specific transformation or take a content-driven action.

Within any network enabled device (e.g., router, switch, network element or terminal such as a computer or smartphone), it is the packet processing subsystem that manages the traversal of the multi-layered network or protocol stack from the lower, physical and network layers all the way through to the application layer.

A packet is the fundamental building block for packet networks. For example, when an item such as a file, e-mail message, voice or video stream is transmitted through the network, it is broken into chunks called packets that can be more efficiently moved through the network than one large block of data.

A CPU is the central element in a computer, and a packet processing module is the central element in a router, switch, modem, network interface card (NIC), and the like.

Of note, packets are not transmitted all the time, only when data needs to be sent. Thus, a packet processing module does not necessarily need to operate at a fixed, worst-case clock speed. With the present disclosure, various network devices ranging from carrier-grade switches and routers to consumer electronics like smart phones with NICs, cable modems, Wi-Fi routers, etc. can operate with less power by optimizing the clock speed of the packet processing module based on workload. Further, due to the nature of packet networking, the exact workload is determinable based on FIFO fill level. Such an approach is described herein that is hardware-based (vs. OS and CPU-based) and that uses a feedback loop to continuously change the system clock to what is needed based on FIFO fill level.

Packet Processing Module with Clock Feedback Loop Based on FIFO Fill Levels

FIG. 1 is a block diagram of a packet processing module 10 with a clock feedback loop 12. FIG. 1 is a functional diagram, and the underlying components can be integrated circuits on a module, FPGA, ASIC, etc. Of course, the underlying components can be discrete components as well; those skilled in the art will recognize any implementation is contemplated consistent with the techniques described herein.

The packet processing module 10 includes a packet processing circuit 14 that receives input packets 16 from N FIFOs 18, N is an integer and can be greater than or equal to 1. The N FIFOs 18 are a buffer circuit that enqueue the input packets 18 and dequeue the packets 18 to the packet processing circuit 14. FIFOs are commonly used in electronic circuits for buffering and flow control between hardware and software. In its hardware form, a FIFO generally includes a set of read and write pointers, storage and control logic. Storage may be static random access memory (SRAM), flip-flops, latches or any other suitable form of storage. The FIFOs 18 are used to store commands/data before the commands/data are processed by the packet processing circuit 14.

The present disclosure contemplates any type or implementation of the N FIFOs 18 and the N FIFOs 18 are configured to provide a real-time value for each one's so-called fill level 20. The present disclosure contemplates using the N FIFOs 18 fill level 20 as a metric for the load of the packet processing circuit 14. That is, the fill level 20 correlates directly to how fast or slow the packet processing circuit 14 needs to operate at, i.e., its module clock 22 speed. This is in contrast to the CPU case where the OS needs to make some prediction based on workload. Rather, the FIFO fill level 20 is a hardware indication available all of the time for continuously setting the module clock 22 via the clock feedback loop 12.

The FIFO fill level 20 of each of the N FIFOs 18 is connected to a PLL programming state machine 24 which is configured to utilize the FIFO fill level 20 to determine the module clock 22 speed, namely the PLL programming state machine 24 provides a programming interface 26 to a PLL 28 which sets the module clock 22 speed.

The packet processing circuit 14 can perform various functions on packets, all of which are contemplated herein. These functions can relate to processing control information, processing data content, and a combination thereof.

PLL

The PLL 28 contemplates various implementations to provide different values of the module clock 22. Generally, the PLL 28 includes frequency dividers to change the module clock 22, based on the programming interface 26. The PLL 28 can include an integer synthesizer, a fractional-N synthesizer, a delta-sigma synthesizer, and the like.

The integer synthesizer (or programmable-N frequency divider) uses a reference frequency to generate a multiple of that frequency. A voltage controlled oscillator (VCO) is initially tuned roughly to the range of the desired frequency multiple. The signal from the VCO is divided down using frequency dividers by a multiplication factor. The divided signal and the reference frequency are fed into a phase comparator. The output of the phase comparator is a voltage that is proportional to the phase difference. After passing through a low pass filter and being converted to the proper voltage range, this voltage is fed to the VCO to adjust the frequency. This adjustment increases the frequency as the phase of the VCO's signal lags that of the reference signal and decreases the frequency as the lag decreases (or lead increases). The VCO will stabilize at the desired frequency multiple.

In some embodiments, the reference frequency may also be divided by an integer multiple before being input to the phase comparator. This allows the synthesis of frequencies that are N/M times the reference frequency. This can be accomplished in a different manner by periodically changing the integer value of an integer-N frequency divider, effectively resulting in a multiplier with both whole number and fractional component. Such a multiplier is called a fractional-N synthesizer after its fractional component. Fractional-N synthesizers provide an effective means of achieving fine frequency resolution with lower values of N, allowing loop architectures with tens of thousands of times less phase noise than alternative designs with lower reference frequencies and higher integer N values. They also allow a faster settling time because of their higher reference frequencies, allowing wider closed and open loop bandwidths.

A delta sigma synthesizer adds a randomization to programmable-N frequency divider of the fractional-N synthesizer. This is done to shrink sidebands created by periodic changes of an integer-N frequency divider.

PLL Programming Examples

The packet processing module 10 can reduce the clock speed of the module clock 22 based on the processing demands to the packet processing circuit 14. The processing demands are determined by how full a FIFO 18 or combination of FIFOs 18 that is at the input 18.

Generally, as the FIFOs 18 fill up, the module clock 22 speed is increased, to handle the higher demand in the module 10, and as the FIFO(s) empty, the module clock 22 speed is reduced because the module 10 is processing commands/data at a faster rate than necessary.

Packet traffic is intermittent meaning the packet processing circuit 14 will not always have to process packets at the same rate. For example, high-bandwidth traffic such as high-definition video can be bursty in nature, whereas steady rate traffic such as voice, audio, can be lower-bandwidth. The packet processing circuit 14 does not always need to operate at a worst-case module clock 22 speed.

The following describes an example approach for the PLL programming state machine 24. The PLL 28 can output the following for the module clock 22:

(1) Highest rate module clock 22 speed—this is the so-called worst-case rate meaning it is the one where the packet processing circuit 14 operates at maximum capacity, highest power, etc. The overall goal of the present disclosure is to reduce this value by some amount such that the packet processing circuit 14 is able to process all the traffic at an optimum module clock 22, thereby saving some power and heat while sacrificing nothing in terms of processing performance, namely every packet is still serviced, just the rate changes as the packet ingress rate changes. The highest rate module clock 22 is implementation specific and some examples can include 250 MHz, 300 MHz, 515 MHz, etc.

(2) Minimum rate module clock 22 speed—this is the so-called minimum rate meaning it is one where the packet processing circuit 14 operates at minimum capacity, i.e., it is "asleep," and ready to wake up if more packets arrive. Also, the minimum rate module clock 22 speed can be implementation specific and some examples can include 50 MHz, 10 MHz, etc.

(3) Intermediate rate module clock 22 speed—these can be any rates between the highest rate module clock 22 and the minimum rate module clock 22, including fractional rates.

The PLL programming state machine 24 receives the FIFO fill level 20 from the N FIFOs 18. The FIFO fill level 20 can be reported differently based on physical implementation. For description herein, assume the FIFO fill level 20 is in percentages where 0% indicates no fill at all and 100% indicated complete fill.

If there is a single FIFO 18, it can continually report its fill level 20 to the PLL programming state machine 24. For example, assume a 32 queue FIFO and that 4 queues are occupied=12.5% fill level 20. If there are N FIFOs 18, N>1, each can continually report its fill level 20 to the PLL programming state machine 24, and the PLL programming state machine 24 can determine an aggregate fill level. For example, assume 2 FIFOs 18 with one reports 50% fill level based on 16 queues being occupied out of 32 queues and the other reporting 25% based on 8 queues being occupied out of 32 queues, then the aggregate fill level is 37.5% based on 24 queues being occupied out of 64 total queues across both the 2 FIFOs 18. Those skilled in the art will recognize there can be various other calculations and determinations for the FIFO fill level 20.

In an embodiment, the PLL programming state machine 24 can set the module clock 22 between the highest rate module clock 22 speed and the minimum rate module clock 22 speed, including at any of the intermediate rate module clock 22 speeds based on the FIFO fill level 20, including the aggregate fill level.

In an embodiment, the PLL programming state machine 24 is configured to set the module clock 22 speed to (1) the highest rate module clock 22 speed when the FIFO fill level 20 is above a high-water mark threshold (e.g., 60-80%), (2) the minimum rate module clock 22 speed when the FIFO fill level 20 is below a low-water mark threshold (e.g., 25%-40%), and (3) to any of the intermediate rate module clock 22 speeds when the FIFO fill level 20 is between the high-water mark threshold and the low-water mark threshold, with there being a linear increase of the intermediate rate module clock 22 speeds from the low-water mark threshold to the high-water mark threshold.

Also, in some embodiments, the feedback loop 12 can continuously operate, meaning the module clock 22 can vary over time. Of note, the ability to change the PLL 28 is extremely quick, less than a microsecond. In another embodiment, the PLL programming state machine 24 may not use the thresholds and simply operate from a low value (e.g., 10 MHz) to the highest rate module clock 22 speed with a linear ramp, i.e., a linear relationship between the FIFO fill level 20 and the module clock 22 speed.

Process Using FIFO Fill Level

Figure 2:
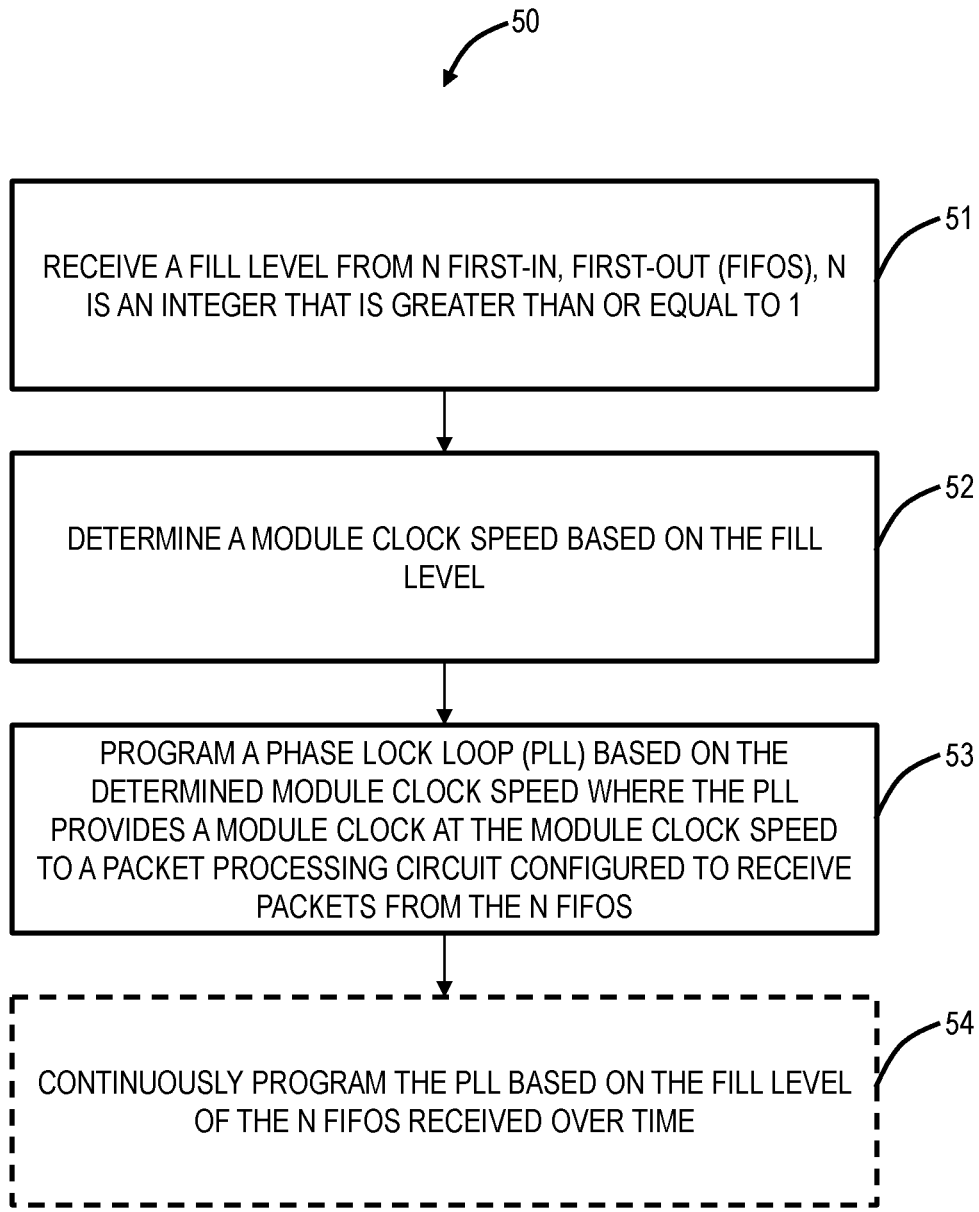
FIG. 2 is a flowchart of a process implemented with a packet processing module to continuously change system clock speed based on load.

FIG. 2 is a flowchart of a process 50 implemented with a packet processing module to continuously change system clock speed based on load. The process 50 contemplates implementation as a method having steps, via an apparatus with circuitry configured to implement the steps, via the packet processing module 10 configured to implement the steps, and via the PLL programming state machine 24 configured to implement the steps.

The process 50 includes receiving a fill level from N first-in, first-out (FIFOs), N is an integer that is greater than or equal to 1 (step 51), determining a module clock speed based on the fill level (step 52), and programming a phase lock loop (PLL) based on the determined module clock speed where the PLL provides a module clock at the module clock speed to a packet processing circuit configured to receive packets from the N FIFOs (step 53). The process 50 can further include continuously programming the PLL based on the fill level of the N FIFOs received over time (step 54).

The packet processing circuit can be configured to perform processing of control information in the received packets, processing of data content in the received packets, and a combination thereof. The PLL can be programmed to increase the module clock speed as the N FIFOs fill up and to decrease the module clock speed as the N FIFOs empty out. In an embodiment, the PLL can be programmed to set the module clock speed to a highest rate when the fill level is above a high-water mark, and a minimum rate when the fill level is below a low-water mark. In another embodiment, the PLL can be programmed to set the module clock speed to a highest rate when the fill level is above a high-water mark, a minimum rate when the fill level is below a low-water mark, and intermediate rates between the highest rate and the minimum rate when the fill level is between the high-water mark and the low-water mark. The module clock speed can have a linear relationship with the fill level. In an embodiment, N is greater than 1 and the fill level is an aggregate of fill levels of each of the N FIFOs.

In another embodiment, the packet processing module 10 includes N first-in, first-out (FIFOs) 18, N is an integer that is greater than or equal to 1; a programming state machine 24 configured to receive a fill level 20 from the N FIFOs 18 and to program a phase lock loop (PLL) 28 based thereon; and a packet processing circuit 14 configured to receive packets from the N FIFOs 18, wherein the packet processing circuit 14 receives a module clock 22 from the PLL 28 with a speed determined by the programming state machine 24.

Advantageously, the present disclosure enables lower clock rates, lower power requirements, etc. without any performance degradation. That is, tying the clock rate to the fill level guarantees the packet processing circuit 14 can always process as designed, while allowing it to operate efficiently. The present disclosure contemplates use in any packet processing system including multi-port, carrier grade switches and routers as well as small devices such as cable modems, Wi-Fi routers, home office switches, etc., and further in any electronic device with a network interface.

Figure 3:
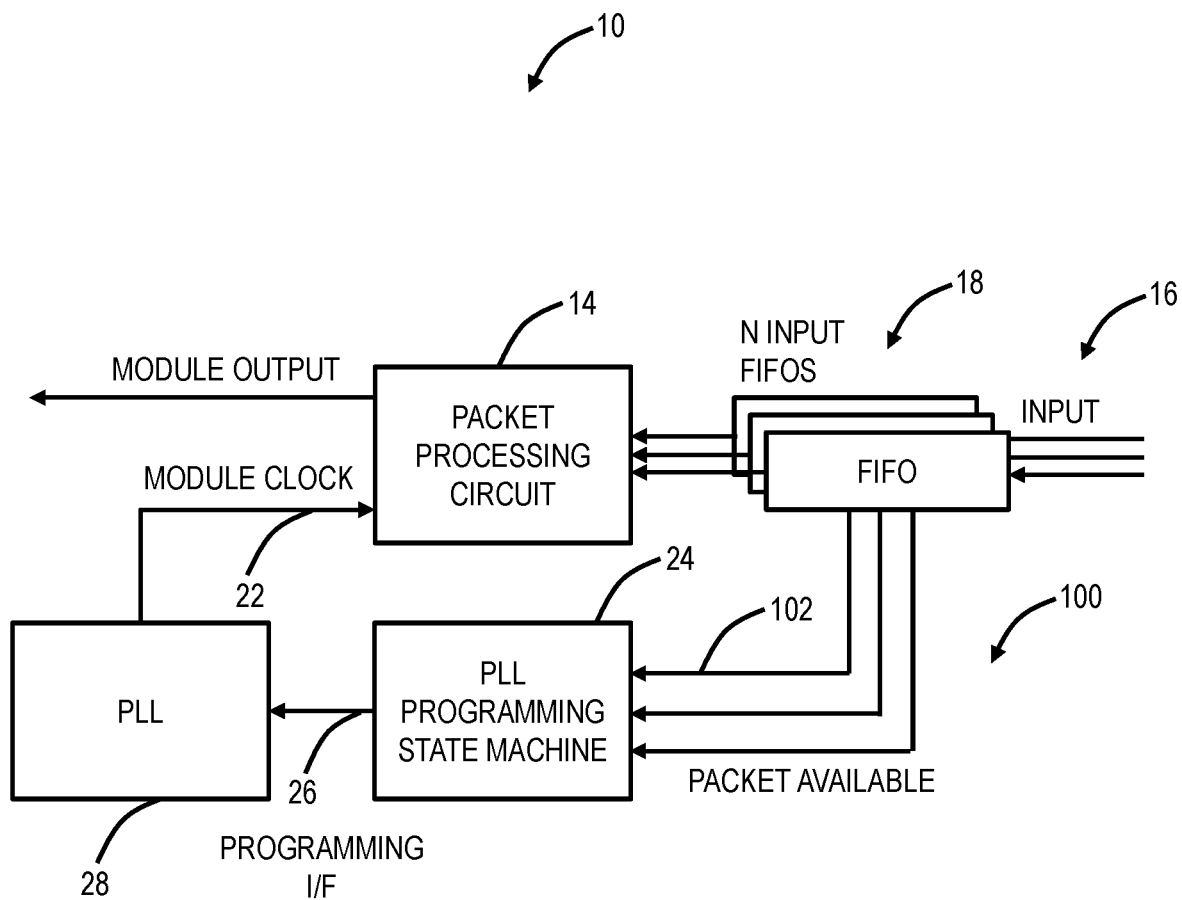
FIG. 3 is a block diagram of a packet processing module with a clock feedback loop based on packet available signals.

Packet Processing Module with Clock Feedback Loop Based on Packet Available Signals FIG. 3 is a block diagram of a packet processing module 10 with a clock feedback loop 100 based on packet available signals 102. Similar to FIG. 1, FIG. 3 is a functional diagram, and the underlying components can be integrated circuits on a module, FPGA, ASIC, etc. Of course, the underlying components can be discrete components as well; those skilled in the art will recognize any implementation is contemplated consistent with the techniques described herein. Also, FIG. 3 includes similar components as FIG. 1, with the differences being the input to the programming state machine 24 from the N FIFOs 18, namely packet available signals 102.

As described herein, a "packet available" signal 102 is output from each FIFO 18 (i.e., goes high) when there is a complete packet of data available to be processed by the packet processing module 10 reading the corresponding FIFO 18. That is, each of the N FIFOs 18 can output a corresponding packet available signal 102. In another embodiment, the present disclosure contemplates using this packet available signal 102 from each of the N FIFOs 102 instead of as well as in combination with the FIFO fill level 20. Of note, the packet available signals 102 can simplify the logic used to determine the clock rate to set of the packet processing module 10, as the clock rate could simply be set to:

MIN CLOCK RATE x NUM active PACKET_AVAILABLE signals

As described herein, the packet available signal 102 is for each FIFO 18 and is asserted (e.g., high) whenever there is a full packet ready in the corresponding FIFO 18 for the packet processing module 10. The FIFO 18 is configured to detect an end of each packet stored therein and assert the packet available signal 102 accordingly. Those skilled in the art will recognize various circuit vendors may used different terminology for the packet available signal 102 and all of these terms are contemplated herewith.

Use of the packet available signals 102 can simplify the logic and implementation, e.g., relative to the FIFO fill levels, since each step size for the clock frequency calculation, is just=NUMBER of active PACKET_AVAILABLE signals) x the minimum clock frequency, where the minimum clock frequency=MAX REQUIRED FREQUENCY divided by the NUMBER of INPUT PORTS where the NUMBER of INPUT PORTS is the number of FIFOs 18, i.e., N.

Again, similar to using FIFO fill level, with the feedback loop 100 based on the number of packet available signals 102, the clock 22 continuously is adjusted as packets are processed so that it runs at the absolute minimum rate to continuously process incoming packets without overflowing the input FIFOs 18. This approach will always run the clock 22 at the slowest possible rate, which saves the maximum amount of power usage at all times.

Feedback Loop

The present disclosure describes the feedback loop 12 based on the FIFO fill level 20 and the feedback loop 100 based on the packet available signals 102. Again, these are deterministic feedback signals from the FIFOs 18 which can be used to set the clock 22 based on the current processing requirements of the packet processing circuit 14. Advantageously, this deterministic feedback is able to set the clock 22 to a minimum required value. This is in contrast to the predictive approaches used with general processors. The present disclosure presents the FIFO fill level 20 and the packet available signals 102 as two examples of deterministic feedback signals. Those skilled in the art will appreciate other types of deterministic feedback signals from the FIFOs 18 are also contemplated, namely any feedback signal that can be used to deterministically calculate an appropriate clock 22 rate.

Process Based on Deterministic Feedback Signals

Figure 4:
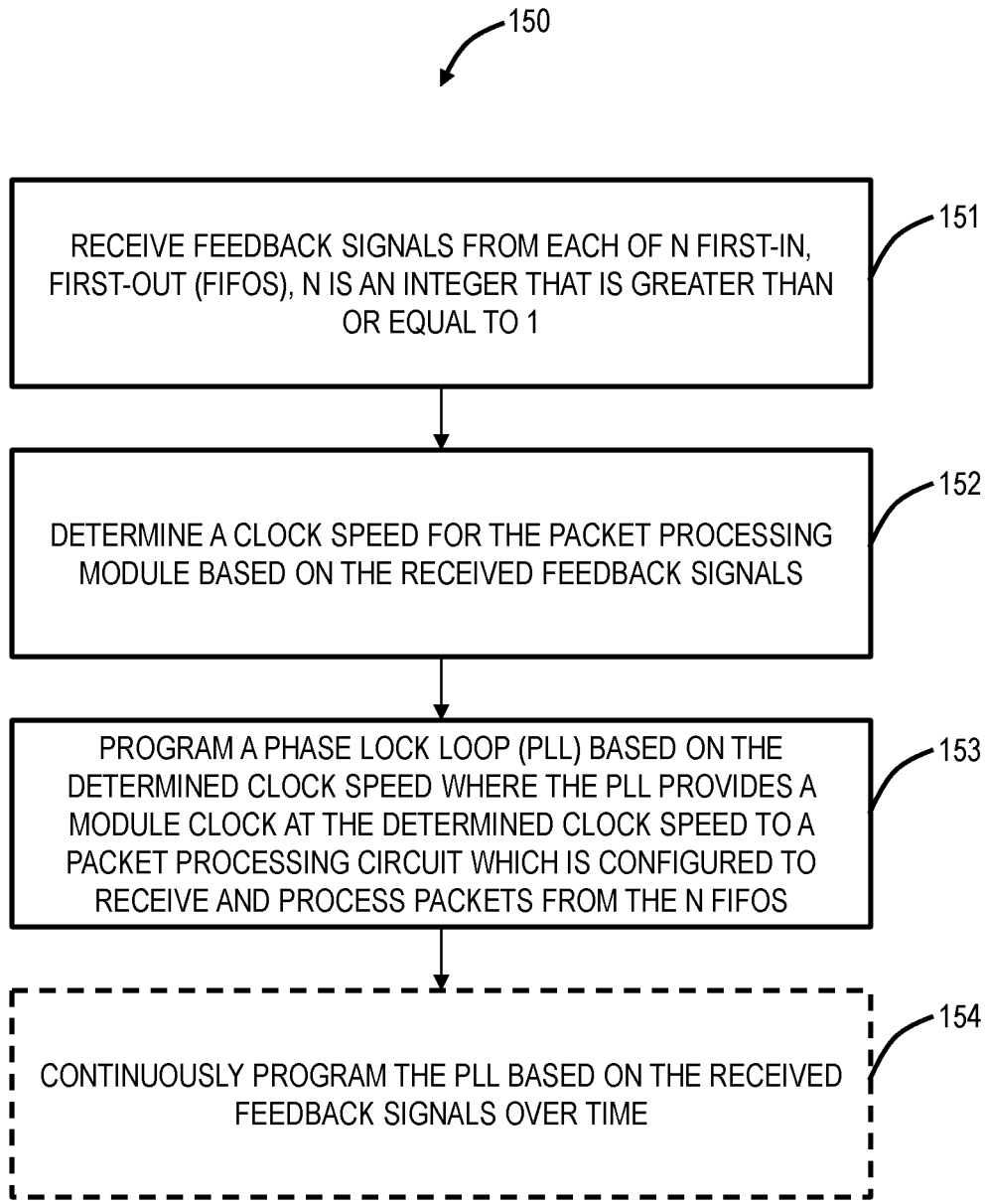
FIG. 4 is a flowchart of a process implemented with a packet processing module to continuously change system clock speed based on deterministic feedback.

FIG. 4 is a flowchart of a process 150 implemented with a packet processing module to continuously change system clock speed based on deterministic feedback. The process 150 contemplates implementation as a method having steps, via an apparatus with circuitry configured to implement the steps, via the packet processing module 10 configured to implement the steps, and via the PLL programming state machine 24 configured to implement the steps.

The process 150 includes receiving feedback signals from each of N first-in, first-out (FIFOs), N is an integer that is greater than or equal to 1 (step 151), determining a clock speed for the packet processing module based on the received feedback signals (step 152), and programming a phase lock loop (PLL) based on the determined clock speed where the PLL provides a module clock at the determined clock speed to a packet processing circuit which is configured to receive and process packets from the N FIFOs (step 153).

In an embodiment, the feedback signals can be each a packet available signal which is asserted for each of the N FIFOs based on detection of a complete packet therein for processing by the packet processing circuit. The determined clock speed can be set based on a number of packet available signals asserted at a given time. The determined clock speed can be set based on a number of packet available signals asserted at a given time multiplied by a minimum clock frequency which is set equal to a maximum clock frequency divided by N.

In another embodiment, the feedback signals can each be a fill level of a given FIFO of the N FIFOs. The feedback signals are a deterministic representation of processing needed for the packet processing circuit given a current state of packets available. The process 150 can further include continuously programming the PLL based on the received feedback signals over time (step 154).

The packet processing circuit can be configured to perform processing of control information in the received packets, processing of data content in the received packets, and a combination thereof. The packet processing circuit can be configured to perform processing of control information in the received packets. The packet processing circuit can be configured to perform processing of data content in the received packets.

In another embodiment, a packet processing module includes N first-in, first-out (FIFOs), N is an integer that is greater than or equal to 1; a programming state machine configured to feedback signals from each of the N FIFOs and to program a phase lock loop (PLL) based thereon; and a packet processing circuit configured to receive packets from the N FIFOs, wherein the packet processing circuit receives a module clock from the PLL with a speed determined by the programming state machine.

In an embodiment, the feedback signals can be each a packet available signal which is asserted for each of the N FIFOs based on detection of a complete packet therein for processing by the packet processing circuit. In another embodiment, the feedback signals can each be a fill level of a given FIFO of the N FIFOs. The feedback signals are a deterministic representation of processing needed for the packet processing circuit given a current state of packets available.

CONCLUSION

Again, it will be appreciated that some embodiments described herein may include one or more generic or specialized processors ("one or more processors") such as microprocessors; central processing units (CPUs); digital signal processors (DSPs): customized processors such as network processors (NPs) or network processing units (NPUs), graphics processing units (GPUs), or the like; field programmable gate arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more application-specific integrated circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured or adapted to," "logic configured or adapted to," etc. perform a set of operations, steps, methods, processes, algorithms, functions, techniques, etc. on digital and/or analog signals as described herein for the various embodiments.

Moreover, some embodiments may include a non-transitory computer-readable storage medium having computer-readable code stored thereon for programming a computer, server, appliance, device, processor, circuit, etc. each of which may include a processor to perform functions as described and claimed herein. Examples of such computer-readable storage mediums include, but are not limited to, a hard disk, an optical storage device, a magnetic storage device, a read-only memory (ROM), a programmable read-only memory (PROM), an erasable programmable read-only memory (EPROM), an electrically erasable programmable read-only memory (EEPROM), Flash memory, and the like. When stored in the non-transitory computer-readable medium, software can include instructions executable by a processor or device (e.g., any type of programmable circuitry or logic) that, in response to such execution, cause a processor or the device to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims. The foregoing sections may include headers for various embodiments and those skilled in the art will appreciate these various embodiments may be used in combination with one another as well as individually. Further, it is noted that the various elements, operations, steps, methods, processes, algorithms, functions, techniques, etc. described herein can be used in any and all combinations with one another.

What is claimed is:

1. A packet processing module comprising circuitry configured to:
    receive feedback signals from each of N first-in, first-out (FIFOs), N is an integer that is greater than or equal to 1,
    determine a clock speed for the packet processing module based on the received feedback signals, and
    program a phase lock loop (PLL) based on the determined clock speed where the PLL provides a module clock at the determined clock speed to a packet processing circuit which is configured to receive and process packets from the N FIFOs,
    wherein the feedback signals are each packet available signal which is asserted for each of the N FIFOs based on detection of a complete packet therein for processing by the packet processing circuit, and
    wherein the determined clock speed is set based on a number of packet available signals asserted at a given time multiplied by a minimum clock frequency which is set equal to a maximum clock frequency divided by N.

2. The packet processing module of claim 1, wherein the feedback signals are each a fill level of a given FIFO of the N FIFOs.

3. The packet processing module of claim 1, wherein the feedback signals are a deterministic representation of processing needed for the packet processing circuit given a current state of packets available.

4. The packet processing module of claim 1, wherein the circuitry is further configured to
    continuously program the PLL based on the received feedback signals over time.

5. The packet processing module of claim 1, wherein the packet processing circuit is configured to perform processing of control information in the received packets, processing of data content in the received packets, and a combination thereof.

6. The packet processing module of claim 1, wherein the packet processing circuit is configured to perform processing of control information in the received packets.

7. The packet processing module of claim 1, wherein the packet processing circuit is configured to perform processing of data content in the received packets.

8. A method comprising steps of:
    receiving feedback signals from each of N first-in, first-out (FIFOs), N is an integer that is greater than or equal to 1;
    determining a clock speed for a packet processing module based on the received feedback signals; and
    programming a phase lock loop (PLL) based on the determined clock speed where the PLL provides a module clock at the determined clock speed to a packet processing circuit in the packet processing module which is configured to receive and process packets from the N FIFOs,
    wherein the feedback signals are each a packet available signal which is asserted for each of the N FIFOs based on detection of a complete packet therein for processing by the packet processing circuit, and
    wherein the determined clock speed is set based on a number of packet available signals asserted at a given time multiplied by a minimum clock frequency which is set equal to a maximum clock frequency divided by N.

9. The method of claim 8, wherein the feedback signals are each a fill level of a given FIFO of the N FIFOs.

10. The method of claim 8, wherein the feedback signals are a deterministic representation of processing needed for the packet processing circuit given a current state of packets available.

11. The method of claim 8, wherein the steps further include
    continuously programming the PLL based on the received feedback signals over time.

12. The method of claim 8, wherein the packet processing circuit is configured to perform processing of control information in the received packets, processing of data content in the received packets, and a combination thereof.

13. A packet processing module comprising:
    N first-in, first-out (FIFOs), N is an integer that is greater than or equal to 1;
    a programming state machine implemented in circuitry and configured to receive feedback signals from each of the N FIFOs and to program a phase lock loop (PLL) based thereon; and
    a packet processing circuit configured to receive packets from the N FIFOs, wherein the packet processing circuit receives a module clock from the PLL with a speed determined by the programming state machine,
    wherein the feedback signals are each a packet available signal which is asserted for each of the N FIFOs based on detection of a complete packet therein for processing by the packet processing circuit, and
    wherein the determined clock speed based on a number of packet available signals asserted at a given time multiplied by a minimum clock frequency which is set equal to a maximum clock frequency divided by N.

14. The packet processing module of claim 13, wherein the feedback signals are each a fill level of a given FIFO of the N FIFOs.

15. The packet processing module of claim 13, wherein the feedback signals are a deterministic representation of processing needed for the packet processing circuit given a current state of packets available.

16. The packet processing module of claim 13, wherein the steps further include
    continuously programming the PLL based on the received feedback signals over time.

17. The packet processing module of claim 13, wherein the packet processing circuit is configured to perform processing of control information in the received packets, processing of data content in the received packets, and a combination thereof.

* * * * *